United States Patent [19]
Petro et al.

[11] Patent Number: 6,154,120
[45] Date of Patent: Nov. 28, 2000

[54] METHOD AND APPARATUS FOR AN N-NARY EQUALITY COMPARATOR

[75] Inventors: Anthony M. Petro; James S. Blomgren, both of Austin, Tex.

[73] Assignee: EVSX, Inc., Austin, Tex.

[21] Appl. No.: 09/206,631

[22] Filed: Dec. 7, 1998

Related U.S. Application Data

[60] Provisional application No. 60/069,250, Dec. 11, 1997.

[51] Int. Cl.[7] .................................................... G05B 1/00
[52] U.S. Cl. ........................................................ 340/146.2
[58] Field of Search ........................................ 340/146.2

[56] References Cited

U.S. PATENT DOCUMENTS 5,729,190   3/1998   Iyengar et al. ........................ 340/146.2

*Primary Examiner*—Margaret R. Wambach
*Attorney, Agent, or Firm*—Booth & Wright, L.L.P.; Matthew J. Booth

[57] ABSTRACT

The present invention is an N-nary equality comparator that receives as inputs two 32-bit 1-of-4 operands. The equality comparator generates an "equal" indicator if the values of the two operands are equal. The equality comparator generates a "not equal" indicator if the values of the two operands are not equal.

8 Claims, 8 Drawing Sheets

METHOD AND APPARATUS FOR AN N-NARY EQUALITY COMPARATOR

This application claims the benefits of the earlier filed US Provisional Application Ser. No. 60/069250, filed Dec. 11, 1997, which is incorporated by reference for all purposes into this application.

BACKGROUND OF THE INVENTION

1. Field of the Invention

The present invention relates to digital computing, and more particularly to an apparatus and method for an equality comparator.

2. Description of the Related Art

An often-useful degenerate form of an adder is an equality comparator, which detects whether two numbers are equal. Comparators are particularly useful in bounds checking situations, where only a binary relationship between two numbers is necessary, since comparators are considerably less complex than full adders. Because a comparator does not utilize sum logic but rather comprises only carry chain logic, it is simpler in structure than a full adder. (An example of a full adder is set forth in co-pending application, U.S. patent Ser. No. 09/206,463 (Our Docket No. 31876.0145), filed Dec. 7, 1998, and entitled "Method and Apparatus for 3-stage 32-bit Adder/Subtractor," hereinafter referred to as "the 3-stage Adder Application.")

N-nary Logic

The present invention utilizes N-nary logic. The N-nary logic family supports a variety of signal encodings, including 1-of-4. The N-nary logic family is described in a copending patent application, U.S. patent application Ser. No. 09/019,355, filed Feb. 5, 1998, and titled "Method and Apparatus for a N-Nary logic Circuit Using 1-of-4 Encoding", which is incorporated herein for all purposes and hereinafter referred to as "The N-nary Patent." In 1-of-4 encoding, four wires are used to indicate one of four possible values. In contrast, traditional static design uses two wires to indicate four values, as is demonstrated in Table 1. In Table 1, the $A_0$ and $A_1$ wires are used to indicate the four possible values for operand A: 00, 01, 10, and 11. The two B wires are similarly used to indicate the same four possible values for operand B.

TABLE 1

| $A_1$ | $A_0$ | $B_1$ | $B_0$ | A = Decimal Value | B = Decimal Value | A + B | A + B = Dec. Value |
|---|---|---|---|---|---|---|---|
| 0 | 0 | 0 | 0 | 0 | 0 | 00 | 0 |
| 0 | 0 | 0 | 1 | 0 | 1 | 01 | 1 |
| 0 | 0 | 1 | 0 | 0 | 2 | 10 | 2 |
| 0 | 0 | 1 | 1 | 0 | 3 | 11 | 3 |
| 0 | 1 | 0 | 0 | 1 | 0 | 01 | 1 |
| 0 | 1 | 0 | 1 | 1 | 1 | 10 | 2 |
| 0 | 1 | 1 | 0 | 1 | 2 | 11 | 3 |
| 0 | 1 | 1 | 1 | 1 | 3 | 00* | 0 |
| 1 | 0 | 0 | 0 | 2 | 0 | 10 | 2 |
| 1 | 0 | 0 | 1 | 2 | 1 | 11 | 3 |
| 1 | 0 | 1 | 0 | 2 | 2 | 00* | 0 |
| 1 | 0 | 1 | 1 | 2 | 3 | 01* | 1 |
| 1 | 1 | 0 | 0 | 3 | 0 | 11 | 3 |
| 1 | 1 | 0 | 1 | 3 | 1 | 00* | 0 |
| 1 | 1 | 1 | 0 | 3 | 2 | 01* | 1 |
| 1 | 1 | 1 | 1 | 3 | 3 | 10* | 2 |

Each output value in the "A+B" column of Table 1 indicated with an asterisk denotes a carry condition where a one has conceptually carried into the next-higher-order bit (the bit position corresponding to a decimal value of four).

"Traditional" dual-rail dynamic logic also uses four wires to represent two bits, but the dual-rail scheme always requires two wires to be asserted. In contrast, N-nary logic only requires assertion of one wire. The benefits of N-nary logic over dual-rail logic, such as reduced power and reduced noise, should be apparent from a reading of The N-nary Patent.

All signals in N-nary logic, including 1-of-4, are of the 1-of-N form where N is any integer greater than one. A 1-of-4 signal requires four wires to encode four values (0–3 inclusive), or the equivalent of two bits (one "dit") of information. More than one wire will never be asserted for a 1-of-N signal. Similarly, N-nary logic requires that a high voltage be asserted for all valid values, even 0. (Some versions of N-nary logic allow a "null" case, where no high voltage is asserted for an N- nary signal, which indicates that the N-nary signal has not yet evaluated, and is not required). Any one N-nary gate may comprise multiple inputs and/or outputs. In such a case, a variety of different N-nary encodings may be employed. For instance, consider a gate that comprises two inputs and two outputs, where the inputs are a 1-of-4 signal and a 1-of-2 signal and the outputs comprise a 1-of-4 signal and a 1-of-3 signal. Various variables, including P, Q, R, and S, may be used to describe the encoding for these inputs and outputs. One may say that one input comprises 1-of-P encoding and the other comprises 1-of-Q encoding, wherein P equals two and Q equals four. Similarly, the variables R and S may be used to describe the outputs. One might say that one output comprises 1-of-R encoding and the other output comprises 1-of-S encoding, wherein R equals four and S equals 3. Through the use of these, and other, additional variables, it is possible to describe multiple N-nary signals that comprise a variety of different encodings.

SUMMARY OF THE INVENTION

The preferred embodiment of the present invention comprises a three-stage 32-bit equality comparator that receives as inputs two 32-bit 1-of-4 operands, A and B, and produces a 1-of-2 output. The first level of logic, the Individual Equality Logic, performs an exclusive or (XOR) operation on individual one-dit pairs of the corresponding dits of the A and B operands to produce a dit-level equality indicator. In the second level of logic, the Block Equality Logic, the dit-level equality indicators are logically AND'ed to form block-level equality indicators. In the final level of logic, the Comparison Logic, the block-level equality indicators are logically AND'ed to form a final 1-of-2 equality indicator.

DETAILED DESCRIPTION OF THE INVENTION

The present invention relates to a three-logic-level equality comparator using N-nary logic. This disclosure describes numerous specific details that include specific formats, structures, circuits, and logic functions in order to provide a thorough understanding of the present invention. One skilled in the art will appreciate that one may practice the present invention without these specific details. Additionally, this disclosure does not describe in detail some well-known structures such as N-FETs, P-FETs, nor does it describe N-nary logic in detail, in order not to obscure the present invention.

The present invention utilizes N-nary logic to implement an equality comparator. Before I discussion of the comparator's logic, a brief discussion of N-nary logic circuits is in order. For illustrative purposes, the discussion begins with a comparison of the binary and 1-of-4 add functions. A truth table for one-bit binary addition is set forth in Table 2.

TABLE 2

| A | B | A + B |
|---|---|-------|
| 0 | 0 | 0 |
| 0 | 1 | 1 |
| 1 | 0 | 1 |
| 1 | 1 | 0* |

In contrast, a truth table demonstrating the add operation using 1-of-4 encoding is set forth in Table 3.

includes more than one wire asserted for each 1-of-4 signal, such as 1111 and 0101. Such values are undefined for the evaluate stage of 1-of-4 logic gates. The four wires for the two-bit sum of the 1-of-4 addition operation in Table 3 are labeled $S_3$, $S_2$, $S_1$, and $S_0$.

In Tables 2 and 3, output values with asterisks indicate that a carry is conceptually generated into the next higher-order bit/dit.

Figure 1:
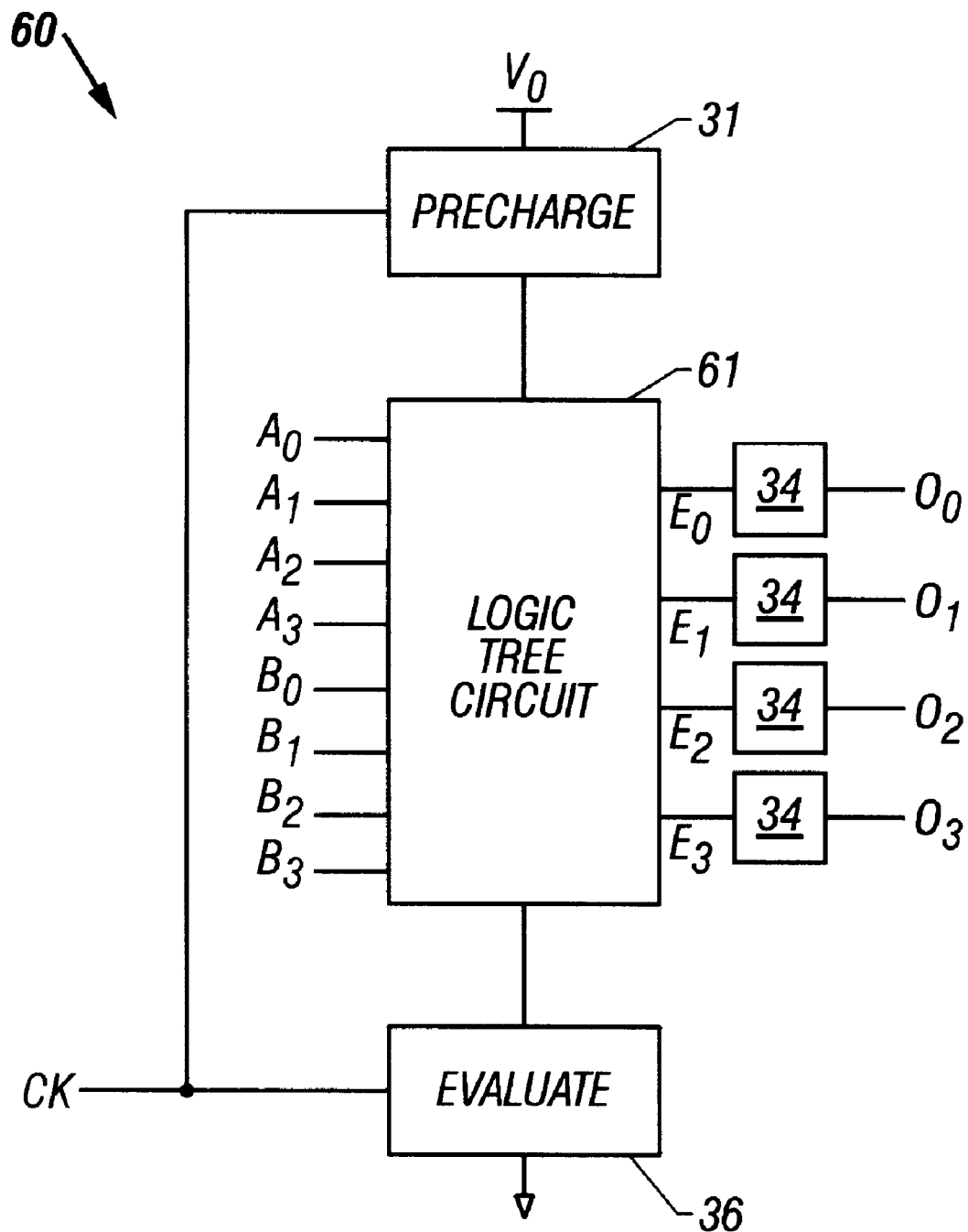
FIG. 1 is a block diagram of an N-nary gate.

FIG. 1 illustrates a 1-of-N logic gate 60 that uses two sets of 1-of-N signals for the inputs and produces one 1-of-N signal for the output. In gate 60, the A and B inputs comprise four wires each, with each set of wires representing 2 bits (one dit) of data. A is a one-dit input, B is a one-dit input, and O is a one-dit output. In other words, the N-nary gate 60 depicted in FIG. 1 comprises 4 input bits (2 dits) and 2 output bits (one dit).

Figure 2:
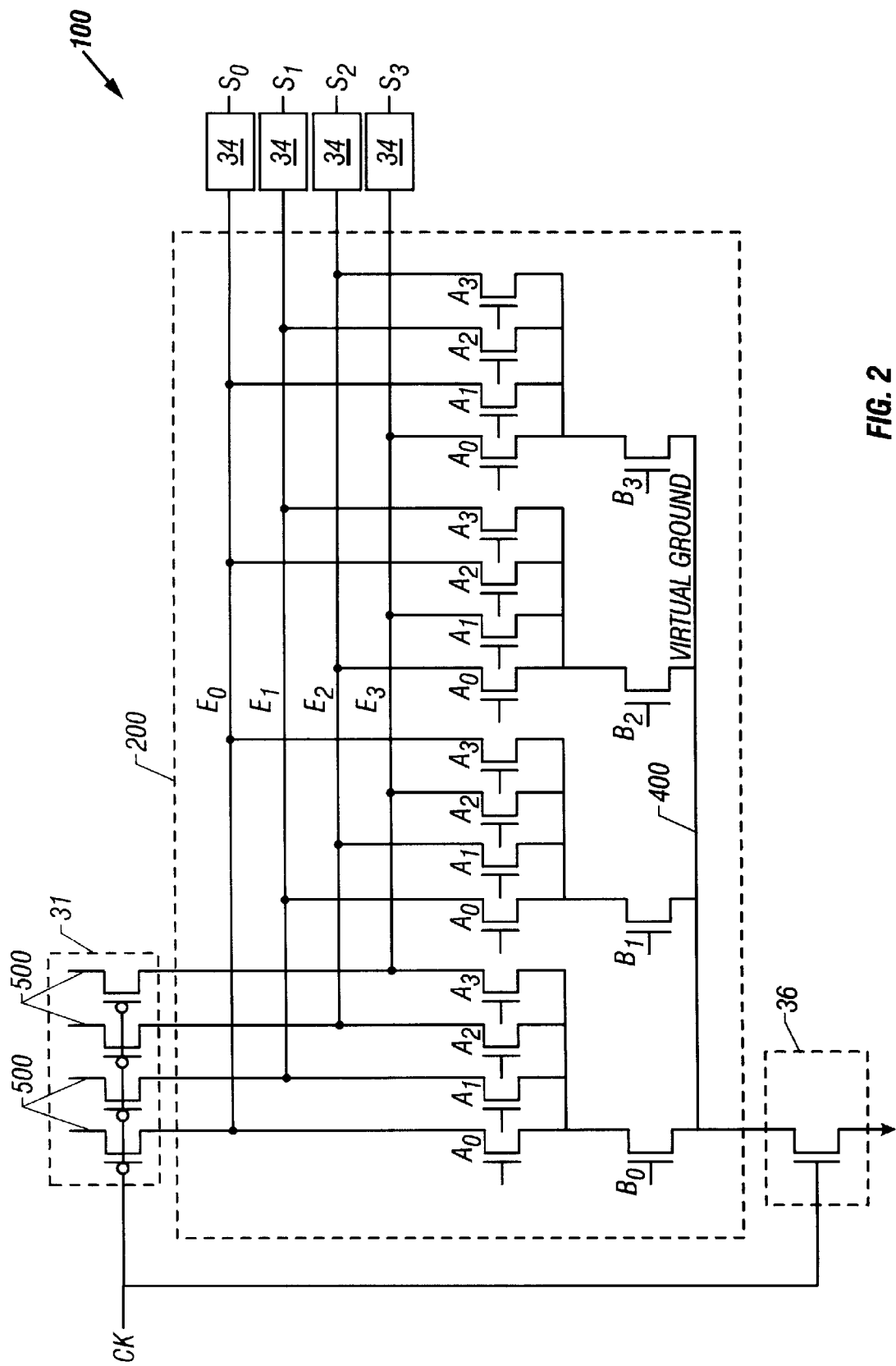
FIG. 2 is an illustration of an N-nary adder gate.

Referring to FIG. 1, each N-nary dit logic circuit 60 comprises a logic tree circuit 61, a precharge circuit 31, and an evaluate circuit 36. The logic tree circuit 61 performs a logic function on the two 1-of-4 input signals that could comprise a variety of functions, for example, the Boolean logic functions AND/NAND and OR/NOR, or the more complex carry-lookahead function of the present invention. The logic gates of the N-nary family are clocked pre-charge (CP) gates. FIG. 2 illustrates that each input into the logic tree circuit 61 is coupled to at least one single N-channel field effect transistor (NFET) $A_0$–$A_3$, $B_0$–$B_3$. Referring back to FIG. 1, the logic tree circuit 61 therefore comprises one or more N-channel FETS. Coupled to the wires of the 1-of-4 output signal are the output buffers 34 that aid in driving additional circuits that couple to the output signal. The preferred embodiment of the present invention uses a circuit with an inverting function as the output buffer 34.

Referring again to FIG. 1, a precharge circuit 31 couples to the logic tree circuit 61 and precharges the dynamic logic of the logic tree circuit 61. The precharge circuit 31 comprises one or more FETs with the preferred embodiment of the circuit comprising P-channel FETs (PFETs). Each evaluation path of the logic tree circuit 61 has its own precharge PFET, shown as 500 in FIG. 2. The PFETs 500 of the precharge circuit 31 quickly and fully precharge all of the dynamic logic in the logic tree circuit 61 during the precharge phase of the clock cycle.

TABLE 3

| $A_3$ | $A_2$ | $A_1$ | $A_0$ | A Dec. Value | $B_3$ | $B_2$ | $B_1$ | $B_0$ | B Dec. Value | $S_3$ | $S_2$ | $S_1$ | $S_0$ | Output Decimal Value |
|---|---|---|---|---|---|---|---|---|---|---|---|---|---|---|
| 0 | 0 | 0 | 1 | 0 | 0 | 0 | 0 | 1 | 0 | 0 | 0 | 0 | 1 | 0 |
| 0 | 0 | 0 | 1 | 0 | 0 | 0 | 1 | 0 | 1 | 0 | 0 | 1 | 0 | 1 |
| 0 | 0 | 0 | 1 | 0 | 0 | 1 | 0 | 0 | 2 | 0 | 1 | 0 | 0 | 2 |
| 0 | 0 | 0 | 1 | 0 | 1 | 0 | 0 | 0 | 3 | 1 | 0 | 0 | 0 | 3 |
| 0 | 0 | 1 | 0 | 1 | 0 | 0 | 0 | 1 | 0 | 0 | 0 | 1 | 0 | 1 |
| 0 | 0 | 1 | 0 | 1 | 0 | 0 | 1 | 0 | 1 | 0 | 1 | 0 | 0 | 2 |
| 0 | 0 | 1 | 0 | 1 | 0 | 1 | 0 | 0 | 2 | 1 | 0 | 0 | 0 | 3 |
| 0 | 0 | 1 | 0 | 1 | 1 | 0 | 0 | 0 | 3 | 0 | 0 | 0 | 1 | 0* |
| 0 | 1 | 0 | 0 | 2 | 0 | 0 | 0 | 1 | 0 | 0 | 1 | 0 | 0 | 2 |
| 0 | 1 | 0 | 0 | 2 | 0 | 0 | 1 | 0 | 1 | 1 | 0 | 0 | 0 | 3 |
| 0 | 1 | 0 | 0 | 2 | 0 | 1 | 0 | 0 | 2 | 0 | 0 | 0 | 1 | 0* |
| 0 | 1 | 0 | 0 | 2 | 1 | 0 | 0 | 0 | 3 | 0 | 0 | 1 | 0 | 1* |
| 1 | 0 | 0 | 0 | 3 | 0 | 0 | 0 | 1 | 0 | 1 | 0 | 0 | 0 | 3 |
| 1 | 0 | 0 | 0 | 3 | 0 | 0 | 1 | 0 | 1 | 0 | 0 | 0 | 1 | 0* |
| 1 | 0 | 0 | 0 | 3 | 0 | 1 | 0 | 0 | 2 | 0 | 0 | 1 | 0 | 1* |
| 1 | 0 | 0 | 0 | 3 | 1 | 0 | 0 | 0 | 3 | 0 | 1 | 0 | 0 | 2* |

Each of the inputs A and B in Table 3 is a two-bit input that can represent one of four values, 0 through 3 inclusive, depending on which of the four wires for each signal asserted. Table 3 discards any potential input value that FIG. 2 is a diagram of an N-nary adder gate. FIG. 2 illustrates that the precharge PFET 500 for an evaluation node E of an N-nary circuit is connected to positive high voltage, Vcc, and is used to create conductive paths between the evaluation node E and Vcc. Each precharge PFET 500 is coupled to an input, the pre-charge signal. When the pre-charge signal for any evaluate node has a low voltage, then there is a conductive path between Vcc and the evaluation node E. Coupled to the precharge circuit 31 is the clock signal CK. A low clock signal on CK will cause the FETs in the logic tree circuit 32 to charge when using P-channel FETs in the precharge circuit 31.

An evaluate circuit 36 couples to the logic tree circuit 61 and controls the evaluation of the logic tree circuit 61. The evaluate circuit 36 comprises one or more FETs connected to the CK signal, with the preferred embodiment of the evaluate circuit comprising a single N-channel FET. The single N-FET acts as an evaluation transistor that is used to control when the gate is sensitive to inputs, and helps avoid races between other devices and excessive power consumption. During the precharge phase, the evaluate circuit 36 receives a low value so that no path to Vss may exist through the NFET(s) of the logic tree circuit 61. During the evaluate phase, the evaluate circuit 36 receives a high signal so that a path to Vss through the NFET(s) of the logic tree circuit 61 may exist. Coupled to the evaluate circuit 36 is the clock signal CK. A high clock signal on CK will cause the FETs in the logic tree circuit 61 to evaluate when using N-channel FETs in the evaluate circuit 36. In other words, when the clock signal is high, the evaluate circuit 36 evaluates the logic tree circuit 61.

Figure 3:
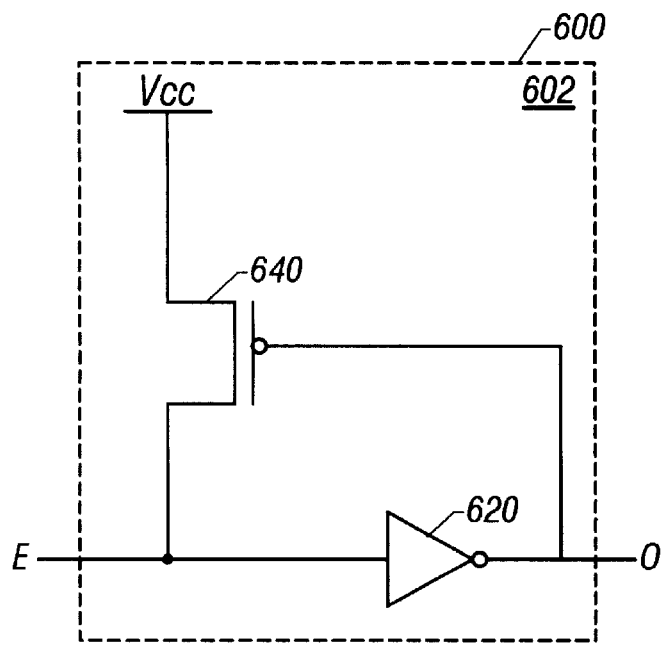
FIG. 3 is a diagram of a first embodiment of an N-nary output driver circuit.
Figure 4:
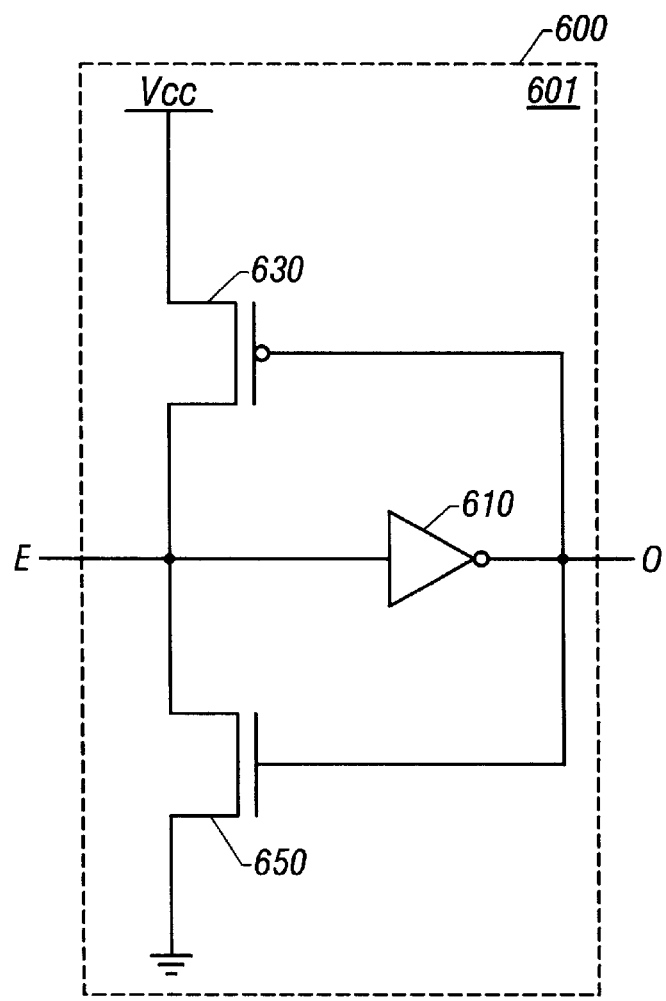
FIG. 4 is a diagram of a second embodiment of an N-nary output driver circuit.

An evaluate node, E, which comprises the four wires $E_0$, $E_1$, $E_2$, and $E_3$, is the signal pathway between the logic tree circuit 61 and an output buffer 34, and constitutes an evaluation path of the logic tree circuit 61. As stated earlier, each evaluation node wire $E_0$, $E_1$, $E_2$, and $E_3$ has its own precharge PFET. The signal on a particular wire, $E_0$, $E_1$, $E_2$, $E_3$ of the evaluate node E is high, only when there is no connection to Vss through the logic tree circuit 61 NFET(s) associated with that particular wire. If the pre-charge signal is low at time 0, and there is no path to ground through the NFET(s) associated with an evaluate node E, of the logic tree circuit 61, then the evaluate node wire E gets pulled to a high voltage. This is called the precharge phase of the gate and we may also say that the gate is in precharge mode. If the precharge signal switches to a high voltage at a later time, the evaluate node E will be floating, but the charge left on it will leave the voltage high. This is called the evaluate phase of the gate, and we may also say that the gate is in evaluate mode. If input signals generate a high voltage for any NFET(s) in the logic tree circuit 61 such that a path from the evaluate node E to ground (Vss) exists, then the charge on the evaluate node E will drain to ground, and the evaluate voltage will drop to Vss. If no such path exists, then the evaluate node E will remain at Vcc. When any gate, therefore, switches from precharge mode to evaluate mode, the evaluate node voltage is high, and it either stays high or goes low. Once the evaluate node voltage goes low during the evaluate phase, it cannot be driven high again until the next precharge phase. Each evaluate node wire $E_0$, $E_1$, $E_2$, and $E_3$ couples to an output buffer 34. Two embodiments of the output driver circuit 600 comprising output buffer 34 are illustrated in FIGS. 3 and 4. FIG. 3 illustrates a half output driver circuit 602 that comprises an inverter 620 and a PFET device 640. FIG. 4 illustrates a full output driver circuit 601 that comprises an inverter 610 coupled to a PFET device 630 and an NFET device 650. Full keeper circuits 601 are only necessary for gates that can be in neither evaluate nor precharge mode. The flow through the output driver circuit 600 is from evaluate node E to the output signal path O. The inverter 610, 620 of the output driver circuit 600 is necessary because the CP gates of the N-nary logic family precharge to a high value and evaluate to a low value. The output driver circuit 34, holds the value during an evaluate phase if the evaluate node E has not discharged. If the evaluate node E has discharged, then there is a path to ground holding its value low. The output of each evaluate node E will switch from high to low once, at most, during an evaluate phase. The output of each evaluate node E, once coupled to an output driver circuit 600 of output buffer 34, is therefore suitable for feeding a subsequent CP gate.

Figure 5:
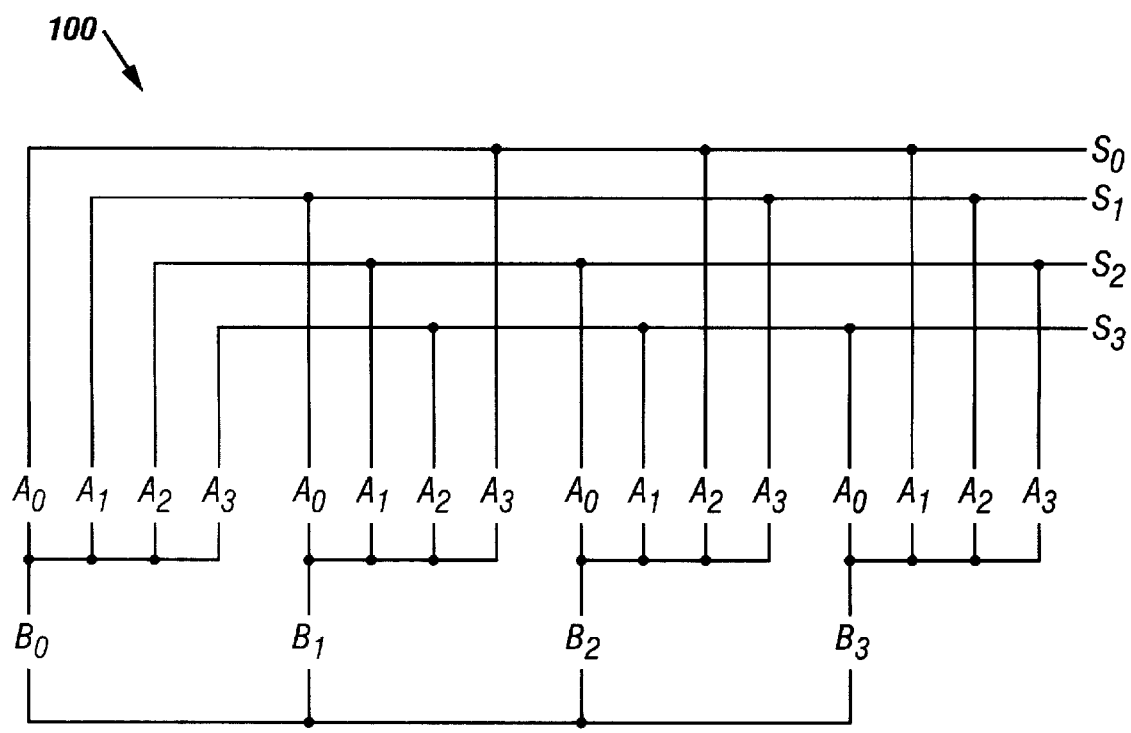
FIG. 5 is a shorthand representation of an N-nary adder gate having two 1-of-4 inputs.
Figure 5A:
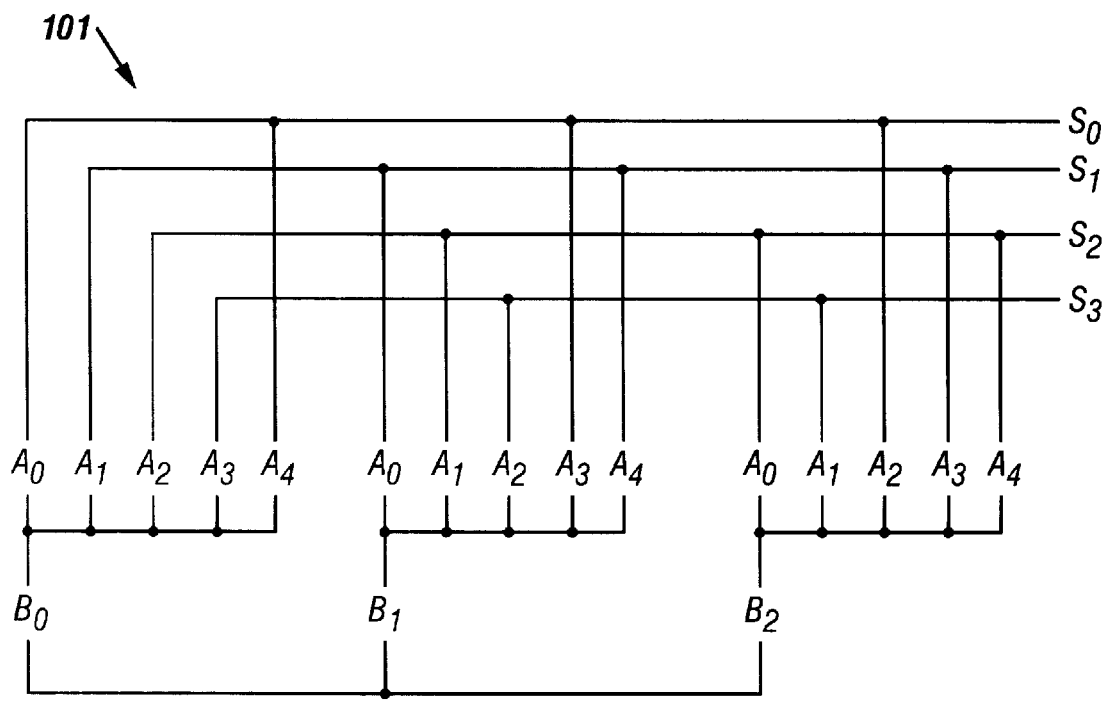
FIG. 5A is a shorthand representation of an N-nary adder gate having one 1-of-3 input and one 1-of-5 input.

A shorthand notation for circuit diagrams can be adopted to avoid needless repetition of elements common to all N-nary circuits. FIG. 2 illustrates these common elements. One common element is the pre-charge P-FET 500. Since all N-nary gates require a pre-charge P-FET 500 for each evaluate node E, the pre-charge P-FETs 500 may be implied and need not be shown. The same is true for the N-FET associated with each input wire of the A and B inputs. Similarly, each evaluate node E must have its own output buffer 34, which may be implied. The N-FET associated with the evaluate node 36 may also be implied. Since these features are common to all N-nary circuits, we may use the shorthand shown in FIG. 5 to represent the N-nary circuits. Accordingly, FIG. 5 illustrates a shorthand notation of the adder gate depicted in FIG. 2. This shorthand notation is used in FIGS. 5, 5A, 8, 8A, 9, and 9A. In each figure, the elements discussed herein should be implied accordingly.

Figure 6:
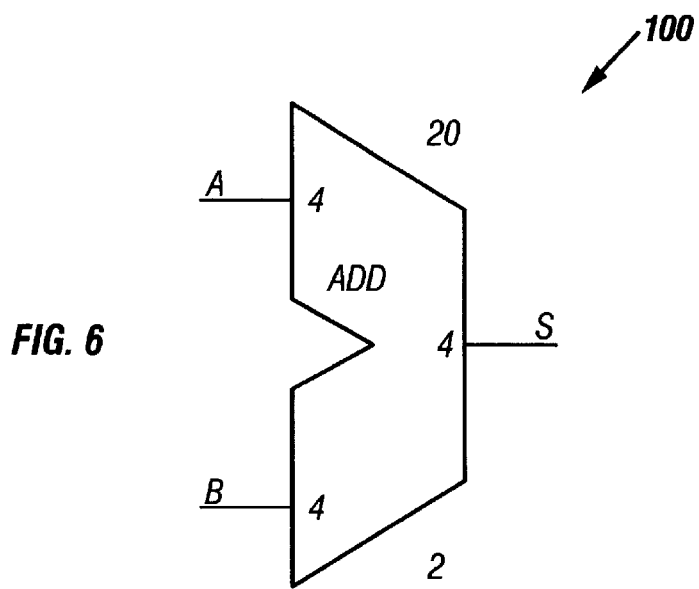
FIG. 6 is a high-level shorthand representation of an N-nary adder gate.

A further simplification to the representation of the FIG. 2 adder is shown in FIG. 6, where the inputs and outputs are shown as single signals that each can represent one of four signals and each impliedly comprises four wires. The number "4" shown within the add gate of FIG. 6, adjacent to the connections, indicates that each signal can represent one of four values. The number above the gate dictates the number of transistors in the evaluate stack, and the number below the FIG. 6 gate represents the maximum number of transistors in series between the evaluate node and virtual ground. This high-level shorthand notation is used in FIGS. 6–9A, including 8A. In each figure, the elements discussed herein should be implied accordingly.

Preferred Embodiment of the Present Invention

One may accomplish an equality comparison either by subtracting or by logically XOR'ing the two numbers whose values are to be compared, and then testing the result for zero. If the result is equal to zero, then the two numbers are equal. In practice, performing a dit-wise Boolean operation and reducing the status of each dit position to a simple Boolean state (equal/not equal) results in the simpler design. The XOR approach requires fewer wires than an approach that sets carry propagate indicators, based on dit-level subtraction, and then routes the carry propagate indicators accordingly. An example of an N-nary comparator that utilizes the subtraction/HPG approach is set forth in a copending patent application, U.S. patent application Ser. No. 09/206,906, filed Dec. 7, 1998, and titled "Method and Apparatus for an N-nary Magnitude Comparator," referred to herein as "the Magnitude Comparator Patent."

Figure 7:
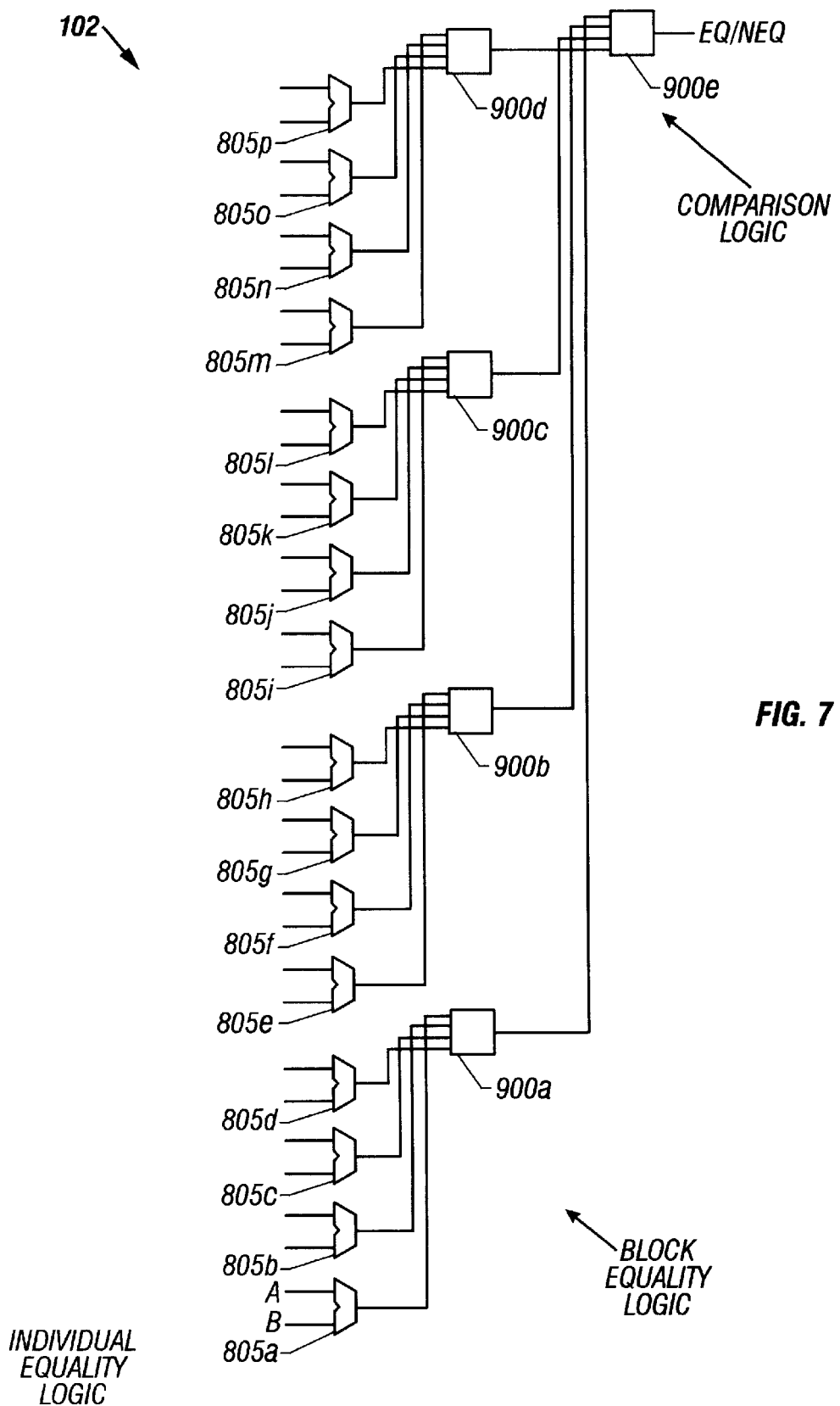
FIG. 7 is a high-level shorthand representation of an N-nary magnitude comparator.

The present invention is fashioned in three Logic Levels: an Individual Equality Logic, a Block Equality Logic, and a Comparison Logic. FIG. 7 illustrates that the A and B operand inputs are processed in groups of one or more bits at a time. The 1-of-4 preferred embodiment of the present invention provides for these groupings of one or more bits of each operand to comprise "dits" that represent two bits of information. FIG. 7 further illustrates that each of the equality comparator's 102 Logic Levels conceptually may be further grouped into "blocks." Blocks represent: a) certain corresponding dits of the two 32-bit 1-of-4 operands, and b) the logic gates of each Logic Level associated with such dits. The least significant block, LSBlk, represents the four least significant dits of each operand, dits 0 through 3 (comprising bits 0 through 7), along with the Individual Equality Logic, Block Equality Logic, and Comparison Logic gates associates with said dits. Similarly, Block Two represents dits 4 through 7 (bits 8 through 15) of the operand and also represents the Individual Equality Logic, Block Equality Logic, and Comparison Logic gates associated with dits 4 through 7. By the same token, Block Three represents dits 8 through 11 (bits 16 through 23) and associated logic gates while the most significant block, MSBlk, represents dits 12 through 15 (bits 24 through 31), and associated logic gates.

Figure 8:
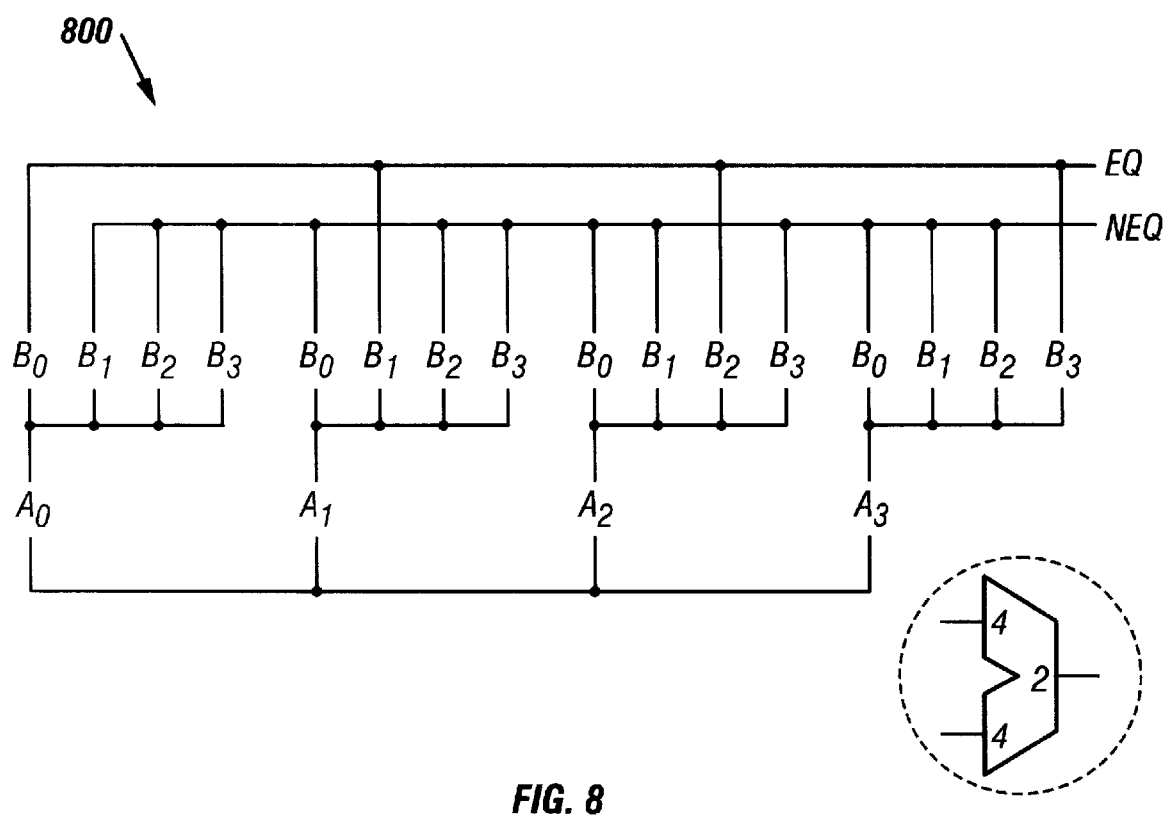
FIG. 8 is a shorthand representation of a dit-level equality gate having two 1-of-4 inputs.

The present invention differs from the approach set forth in the Magnitude Comparator Patent in that it uses a "dit-level equality gate," in the first logic level rather than a subtraction/HPG gate. There are many possible embodiments of such a gate. A first embodiment of a dit-level equality gate 800 is illustrated in FIG. 8. A second level of a dit-level equality gate 800 is illustrated in FIG. 8. FIG. 7 illustrates that the equality comparator 102 of the present invention comprises one dit-level equality gate for each pair of A and B operand dits.

FIG. 7 illustrates that the second Logic Level, the Block Equality Logic, comprises four block equality gates 900a, 900b, 900c, 900d, one each for LSBlk, Block Two, Block Three, and MSBlk. Each of the block equality gates 900a, 900b, 900c, 900d receives four dit-level equality indicators as inputs and generates a 1-of-2 block-level equality indicator that is passed to the Comparison Logic. The operation of the block equality gate 900 is discussed in further detail below.

The third Logic Level, the Comparison Logic, comprises one block equality gate 900e referred to herein as the "comparison gate." The gate comparison gate 900e receives as inputs the four block equality indicators generated by the Block Equality Logic gates 900a–900d. The comparison gate 900e indicates with a 1-of-2 output whether every single dit of the A and B operands are equal. As with the gates of the other two Logic Levels, the operation of the comparison gate 900e is discussed in further detail below.

First Level Individual Equality Gates

Figure 8A:
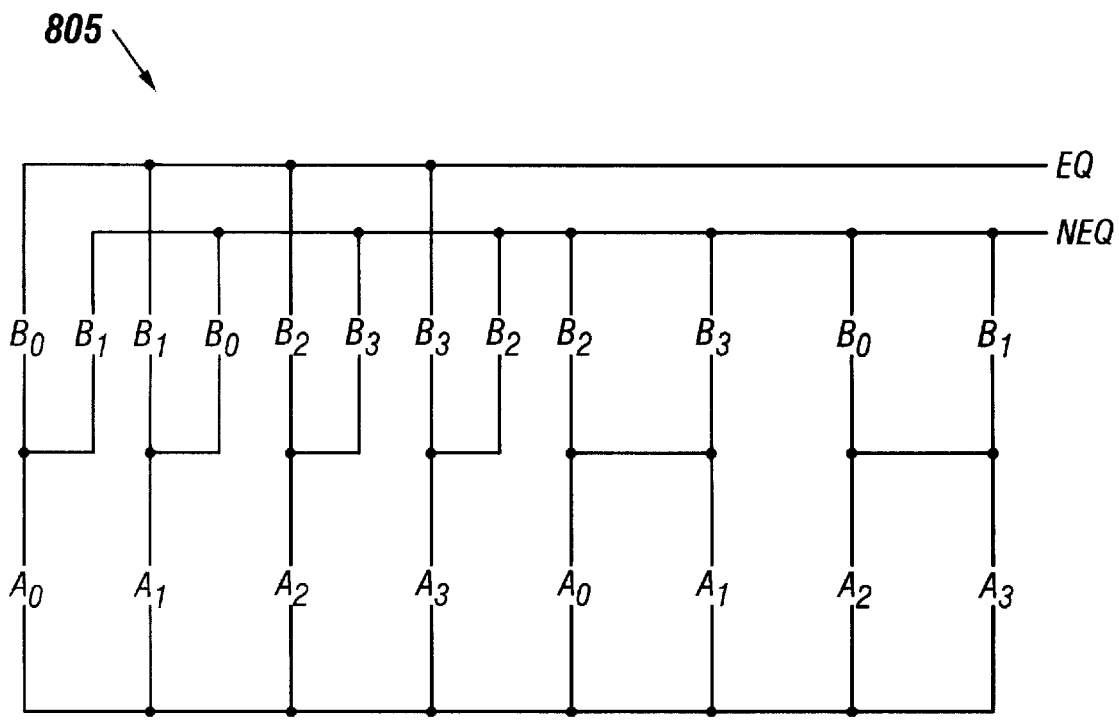
FIG. 8A is a shorthand representation of an alternative embodiment of a dit-level equality gate having two 1-of-4 inputs.

FIG. 8A illustrates the preferred embodiment of the dit-level equality gate 805 of the present invention. FIG. 8 illustrates an alternative embodiment of the dit-level equality gate 800. Both gates implement the same function, which is described below. While each gate 800, 805 comprises the same number of transistors, Gate 805 exhibits better input load balance and better capacitance isolation.

FIG. 7 indicates that the present invention 102 comprises one dit-level equality gate 805 for each pair of A and B operand dits. The present invention 102 therefore comprises sixteen dit-level equality gates 805a–805p. FIG. 8 illustrates that the dit-level equality gate 805 performs the XOR function on two 1-of-4 one-dit inputs. The output of Gate 800 conforms to Table 4.

TABLE 4

| $A_3$ | $A_2$ | $A_1$ | $A_0$ | $B_3$ | $B_2$ | $B_1$ | $B_0$ | EQ | NEQ |
|---|---|---|---|---|---|---|---|---|---|
| 0 | 0 | 0 | 1 | 0 | 0 | 0 | 1 | 1 | 0 |
| 0 | 0 | 0 | 1 | 0 | 0 | 1 | 0 | 0 | 1 |
| 0 | 0 | 0 | 1 | 0 | 1 | 0 | 0 | 0 | 1 |
| 0 | 0 | 0 | 1 | 1 | 0 | 0 | 0 | 0 | 1 |
| 0 | 0 | 1 | 0 | 0 | 0 | 0 | 1 | 0 | 1 |
| 0 | 0 | 1 | 0 | 0 | 0 | 1 | 0 | 1 | 0 |
| 0 | 0 | 1 | 0 | 0 | 1 | 0 | 0 | 0 | 1 |
| 0 | 0 | 1 | 0 | 1 | 0 | 0 | 0 | 0 | 1 |
| 0 | 1 | 0 | 0 | 0 | 0 | 0 | 1 | 0 | 1 |
| 0 | 1 | 0 | 0 | 0 | 0 | 1 | 0 | 0 | 1 |
| 0 | 1 | 0 | 0 | 0 | 1 | 0 | 0 | 1 | 0 |
| 0 | 1 | 0 | 0 | 1 | 0 | 0 | 0 | 0 | 1 |
| 1 | 0 | 0 | 0 | 0 | 0 | 0 | 1 | 0 | 1 |
| 1 | 0 | 0 | 0 | 0 | 0 | 1 | 0 | 0 | 1 |
| 1 | 0 | 0 | 0 | 0 | 1 | 0 | 0 | 0 | 1 |
| 1 | 0 | 0 | 0 | 1 | 0 | 0 | 0 | 1 | 0 |

A Boolean exclusive OR operation requires one OR the other of the operands to be true, but not both. In order to understand the operation of Gate 800 as set forth in Table 4, it may be useful to review the operation of XOR for one and two-bit operands in binary logic. The XOR operation for two binary operands is set forth in Table 5.

TABLE 5

| A | B | XOR |
|---|---|---|
| 0 | 0 | 0 |
| 0 | 1 | 1 |
| 1 | 0 | 1 |
| 1 | 0 | 0 |

In addition to the one-bit binary operation set forth in Table 5, the XOR operation may also be performed on two two-bit binary operands, A and B, where A comprises two bits, $A_1$ and $A_0$, and B comprises two bits, $B_1$ and $B_0$. The truth table for this binary two-bit operation is set forth in Table 6.

TABLE 6

| $A_1$ | $A_0$ | A Dec. Value | $B_1$ | $B_0$ | B Dec. Value | XOR | XOR Dec. Value |
|---|---|---|---|---|---|---|---|
| 0 | 0 | 0 | 0 | 0 | 0 | 00 | 0 |
| 0 | 0 | 0 | 0 | 1 | 1 | 00 | 1 |
| 0 | 0 | 0 | 1 | 0 | 2 | 10 | 2 |
| 0 | 0 | 0 | 1 | 1 | 3 | 11 | 3 |
| 0 | 1 | 1 | 0 | 0 | 0 | 01 | 1 |
| 0 | 1 | 1 | 0 | 1 | 1 | 00 | 0 |
| 0 | 1 | 1 | 1 | 0 | 2 | 11 | 3 |
| 0 | 1 | 1 | 1 | 1 | 3 | 10 | 2 |
| 1 | 0 | 2 | 0 | 0 | 0 | 10 | 2 |
| 1 | 0 | 2 | 0 | 1 | 1 | 11 | 3 |
| 1 | 0 | 2 | 1 | 0 | 2 | 00 | 0 |
| 1 | 0 | 2 | 1 | 1 | 3 | 01 | 1 |
| 1 | 1 | 3 | 0 | 0 | 0 | 11 | 3 |
| 1 | 1 | 3 | 0 | 1 | 1 | 10 | 2 |
| 1 | 1 | 3 | 1 | 0 | 2 | 01 | 1 |
| 1 | 1 | 3 | 1 | 1 | 3 | 00 | 0 |

From Table 6, one can easily create a truth table for a 1-of-4 implementation of the XOR function, with the two-bit A and B operands and XOR result each being represented as one-dit 1-of-4 signals. Such a 1-of-4 N-nary XOR truth table is set forth in Table 7, where the A operand is a 1-of-4 value comprising four wires, $A_3$–$A_0$, the B operand is a 1-of-4 value comprising four wires, $B_3$–$B_0$, and the XOR result is a 1-of-4 value comprising four wires, $X_3$–$X_0$. In Table 7, the columns indicated "A(D)", "B(D)", and "X(D)" represent the decimal values for A, B, and X, respectively.

TABLE 7

| $A_3$ | $A_2$ | $A_1$ | $A_0$ | A (D) | $B_3$ | $B_2$ | $B_1$ | $B_0$ | B (D) | $X_3$ | $X_2$ | $X_1$ | $X_0$ | X (D) |
|---|---|---|---|---|---|---|---|---|---|---|---|---|---|---|
| 0 | 0 | 0 | 1 | 0 | 0 | 0 | 0 | 1 | 0 | 0 | 0 | 0 | 1 | 0 |
| 0 | 0 | 0 | 1 | 0 | 0 | 0 | 1 | 0 | 1 | 0 | 0 | 1 | 0 | 1 |
| 0 | 0 | 0 | 1 | 0 | 0 | 1 | 0 | 0 | 2 | 0 | 1 | 0 | 0 | 2 |
| 0 | 0 | 0 | 1 | 0 | 1 | 0 | 0 | 0 | 3 | 1 | 0 | 0 | 0 | 3 |
| 0 | 0 | 1 | 0 | 1 | 0 | 0 | 0 | 1 | 0 | 0 | 0 | 1 | 0 | 1 |
| 0 | 0 | 1 | 0 | 1 | 0 | 0 | 1 | 0 | 1 | 0 | 0 | 0 | 1 | 0 |
| 0 | 0 | 1 | 0 | 1 | 0 | 1 | 0 | 0 | 2 | 1 | 0 | 0 | 0 | 3 |
| 0 | 0 | 1 | 0 | 1 | 1 | 0 | 0 | 0 | 3 | 0 | 1 | 0 | 0 | 2 |
| 0 | 1 | 0 | 0 | 2 | 0 | 0 | 0 | 1 | 0 | 0 | 1 | 0 | 0 | 2 |
| 0 | 1 | 0 | 0 | 2 | 0 | 0 | 1 | 0 | 1 | 1 | 0 | 0 | 0 | 3 |
| 0 | 1 | 0 | 0 | 2 | 0 | 1 | 0 | 0 | 2 | 0 | 0 | 0 | 1 | 0 |
| 0 | 1 | 0 | 0 | 2 | 1 | 0 | 0 | 0 | 3 | 0 | 0 | 1 | 0 | 1 |
| 1 | 0 | 0 | 0 | 3 | 0 | 0 | 0 | 1 | 0 | 1 | 0 | 0 | 0 | 3 |
| 1 | 0 | 0 | 0 | 3 | 0 | 0 | 1 | 0 | 1 | 0 | 1 | 0 | 0 | 2 |
| 1 | 0 | 0 | 0 | 3 | 0 | 1 | 0 | 0 | 2 | 0 | 0 | 1 | 0 | 1 |
| 1 | 0 | 0 | 0 | 3 | 1 | 0 | 0 | 0 | 3 | 0 | 0 | 0 | 1 | 0 |

Figure 10:
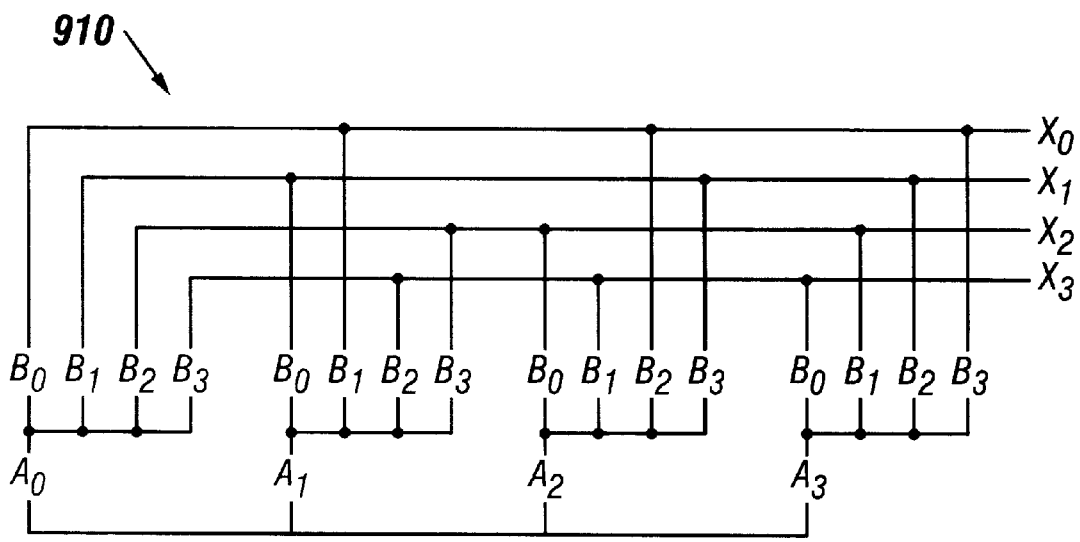
FIG. 10 is a shorthand representation of an N-nary XOR gate.

For informational purposes, FIG. 10 illustrates an N-nary gate 910 that implements the function set forth in Table 7. From a review of FIG. 10 and Table 7, one can see that it is quite simple to create a Boolean-type Equal/Not Equal output from the outputs of the gate 910 illustrated in FIG. 10. FIG. 10 and Table 7 illustrate that the $X_0$ output node is only pulled high for situations where A and B are equal. Thus, the $X_0$ output node of Gate 910 corresponds to the EQU output node illustrated in FIGS. 8 and 8A for the dit-level equality gates 800, 805. In contrast, FIG. 10 illustrates that all other output nodes for Gate 910 (that is, nodes $X_1$, $X_2$, and $X_3$) correspond to the NEQ output node for Gate 800 and 805. A comparison of FIG. 8 and FIG. 10 therefore illustrate that the NEQ evaluate node for Gates 800 and 805 correspond to all rows of Table 7 where X does not equal zero.

Referring now back to FIGS. 8 and 8A and to Table 4, in the N-nary implementation of the XOR function set forth therein, the NEQ output wire is asserted for any combination of A and B inputs that are not equal. If A and B are equal, the EQ output wire is asserted. The EQ and NEQ wires together comprise the dit-level equality indicator that is passed to the block equality gates 900a–900d of the second Logic Level.

Second and Third Level Block Equality Gates

The second Logic Level performs one function—it generates a block-level equality indicator for each of the four four-dit blocks comprising the A and B operands. Labeled in FIG. 7 as the Block Equality Logic, FIG. 7 illustrates that this second Logic Level comprises four block equality gates 900a–900d. Gate 900a generates a block equality indicator for the LSBlk, Gate 900b generates a block equality indicator for Block Two, Gate 900c corresponds to Block Three, and Gate 900d corresponds to the MSBlk. Each block equality gate 900a–900d generates a block equality indicator with a value of 'EQU' if the four A operand dits comprising its block exactly match the values of the corresponding B operand dits within the block. These block equality indicators are used by the Comparison Logic to generate a final equality indicator.

Figure 9:
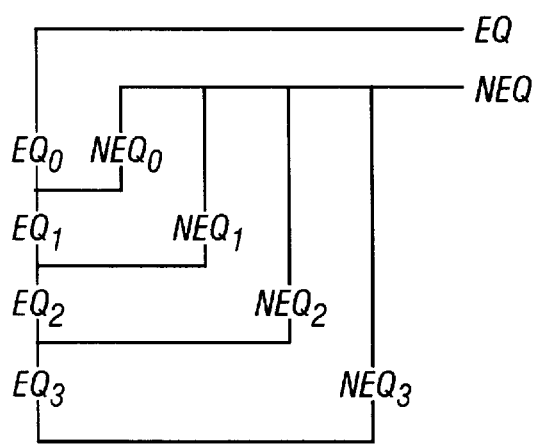
FIG. 9 is a shorthand representation of block equality gate having two 1-of-4 inputs.

Gate 900 computes a block-level equality indicator based on four individual dit-level equality indicators generated by the Individual Equality Logic. FIG. 9 illustrates that each block equality gate 900a–900d receives four dit-level equality indicators as inputs. FIG. 7 illustrates that Gate 900a processes the four dit-level equality indicators for the LSBlk, corresponding to dits 0 through 3. Gate 900b processes the dit-level equality indicators for dits 4 through 7, which comprise Block Two. Gate 900c processes the dit-level equality indicators for dits 8 through 11, which comprise Block Three. Finally, Gate 900d processes the dit-level equality indicators corresponding to the MSBlk, those for dits 12 through 15.

The block equality gate 900 is illustrated in FIG. 900. The gate 900 is a NAND gate that produces an EQ output value if all four inputs equal an EQ value. The gate 900 produces a NEQ output value if any one or more inputs equal a NEQ value. For Gate 900a, the EQ3/NEQ3 signal illustrated in FIG. 9 corresponds to the dit-level equality indicator for dit 3. The EQ2/NEQ2, EQ1/NEQ1, and EQ0/NEQ0 signals illustrated in FIG. 9 correspond, for Gate 900a, to the dit-level indicators for dits 2, 1, and 0, respectively. For Gate 900b, the EQ3/NEQ3, EQ2/NEQ2, EQ1/NEQ1, and EQU0/NEQ0 signals correspond to the dit-level indicators for dits 7, 6, 5, and 4, respectively. For Gate 900c, the EQ3/NEQ3, EQ2/NEQ2, EQ1/NEQ1, and EQU0/NEQ0 signals correspond to the dit-level indicators for dits 11, 10, 9, and 8, respectively. For Gate 900d, the EQ3/NEQ3, EQ2/NEQ2, EQ1/NEQ1, and EQU0/NEQ0 signals correspond to the dit-level indicators for dits 15, 14, 13, and 12, respectively.

Figure 9A:
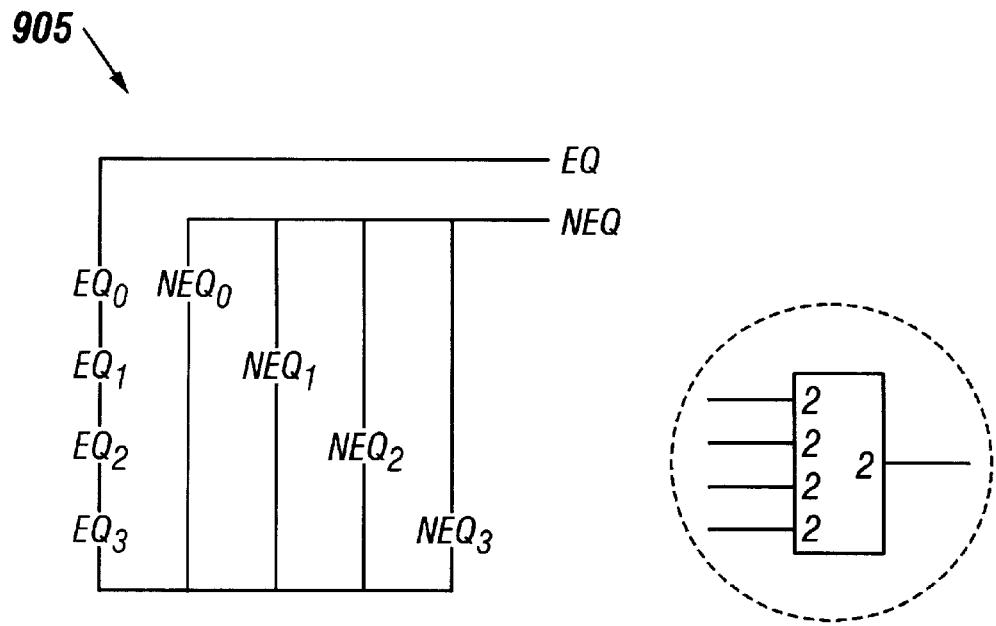
FIG. 9A is a shorthand representation of an alternative embodiment of a block equality gate.

FIG. 9 illustrates that the block equality gate 900 begins its processing with an evaluation of the EQ3/NEQ3 input. If NEQ3 is asserted, then the gate 900 immediately asserts its NEQ output wire and no other dit-level equality inputs are evaluated. If EQ3 is asserted, then the next input value is examined. The gate 900 continues in this fashion until a NEQ value is encountered or until all inputs have been evaluated, whichever comes first. By evaluating the dit-level equality indicator for the MSD of its corresponding block, and then evaluating the dit-level equality indicator for dits of successively lesser significance only if necessary, the gate 900 eliminates unnecessary evaluation of dit-level equality indicators. For instance, if the A and B operand values for the MSD of a given block are not equal, then the entire block does not match, regardless of whether A and B operand dits of lesser significance within the block match or not. Of course, it is not necessary to practice the present invention that this efficiency feature be utilized. For example, an alternative embodiment of a block equality gate 905 is illustrated in FIG. 9A.

FIG. 7 illustrates that the 1-of-2 block evaluation indicator output from each of the block equality gates 900a–900d is an input into the third Logic Level comparison gate 900e, which is itself structurally equivalent to a block equality gate 900. FIG. 7 illustrates, however, that the function of the gates is different. The comparison gate 900e receives as its inputs four block-level equality indicators rather than four dit-level equality indicators. FIGS. 7 and 9 illustrate that the output from block equality gate 900a, representing the block-level equality indicator for the LSBlk, is labeled in FIG. 9 as the EQ0/NEQ0 input into gate 900e. The Gate 900b output, representing the block-level equality indicator for Block Two, is labeled in FIG. 9 as the EQ1/NEQ1 input into gate 900e. The Gate 900c output, representing the block-level equality indicator for Block Three, is labeled in FIG. 9 as the EQ2/NEQ2 input into gate 900e. The Gate 900d output, representing the block-level equality indicator for the MSBlk, is labeled in FIG. 9 as the EQ3/NEQ3 input into gate 900e. The comparison gate 900e processes its inputs in the same manner described above for the block equality gates 900a–900d. Again, the block-level equality indicator for the MSBlk is considered first, with the block-level equality indicators for successively less significant blocks being evaluated if necessary. The comparison gate 900e generates the final output indicator for the equality comparator 102, asserting the EQ wire if all of the block-level equality indicators indicate that the values of the A and B operand dits within every block are equal. The comparison gate 900e generates asserts the NEQ wire if any block-level equality indicator inputs an NEQ value into the comparison gate 900e In sum, the preferred embodiment of the present invention receives as inputs two 1-of-4 32-bit operands. The Individual Equality Logic of the present invention determines whether the dit-wise XOR of each dit of the A and B operands indicates that the values of the dits are equal. These dit-level equality indicators are used by the Block Equality Logic to determine whether every dit within each of four four-dit blocks is equal. The block-level equality indicators generated by the Block Equality Logic are used by the Comparison Logic to make a final determination of whether every dit of the A operand is equal to the value of the corresponding B operand dit. If all dits of the A operand are equal to all corresponding dits of the B operand, the Comparison Logic asserts the EQ output wire as the final equality indicator for the comparator 102. If any dit of the A operand does not equal the value of its corresponding B operand dit, then the Comparison Logic asserts the NEQ output wire as the final equality indicator for the comparator 102.

Other embodiments of the invention will be apparent to those skilled in the art after considering this specification or practicing the disclosed invention. The specification and examples above are exemplary only, with the true scope of the invention being indicated by the following claims.

We claim:

1. An apparatus that compares the values of two N-nary operands, comprising:
   a 1-of-P first input that receives a 1-of-P first operand;
   a 1-of-Q second input that receives a 1-of-Q second operand;
   a 1-of-R result output that delivers a 1-of-R result;
   an individual equality logic, coupled to said first input and to said second input, that produces an indication of whether the value of a grouping of one or more bits of said first operand is equal to the value of a corresponding grouping of one or more bits of the said second operand;
   a block equality logic, coupled to said individual equality logic, that produces a block equality indicator; and
   a comparison logic, coupled to said block equality logic and to said result output, that produces said 1-of-R result, where said 1-of-R result comprises an equal value if the value of said first operand is equal to the value of said second operand, said 1-of-R result further comprises a not equal value if the value of said first operand is not equal to the value of said second operand.

2. The apparatus of claim 1 wherein P and Q equal four and wherein R equals two.

3. A system for comparing the values of two N-nary operands, comprising:
   a first input means for receiving a 1-of-P first operand;
   a second input means for receiving a 1-of-Q second operand;
   a result output means for delivering a 1-of-R result;
   an individual equality logic means, coupled to said first input means and to said second input means, for producing an indication of whether the value of a grouping of one or more bits of said first operand is equal to the value of a corresponding grouping of one or more bits of the said second operand;
   a block equality logic means, coupled to said individual equality logic means, for producing a block equality indicator; and
   a comparison logic means, coupled to said block equality logic means and to said result output means, for producing said 1-of-R result, where said 1-of-R result comprises an equal value if the value of said first operand is equal to the value of said second operand, said 1-of-R result further comprises a not equal value if the value of said first operand is not equal to the value of said second operand.

4. The system of claim 3 wherein P and Q equal four and wherein R equals two.

5. A method to make an apparatus that compares the values of two N-nary operands, comprising:
   providing a 1-of-P first input that receives a 1-of-P first operand;
   providing a 1-of-Q second input that receives a 1-of-Q second operand;
   providing a 1-of-R result output that delivers a 1-of-R result;
   providing an individual equality logic that produces an indication of whether the value of a grouping of one or more bits of said first operand is equal to the value of a corresponding grouping of one or more bits of the said second operand;
   coupling said individual equality logic to said first input and to said second input;
   providing a block equality logic that produces a block equality indicator;
   coupling said block equality logic to said individual equality logic;
   providing a comparison logic that produces said 1-of-R result, where said 1-of-R result comprises an equal value if the value of said first operand is equal to the value of said second operand, said 1-of-R result further comprises a not equal value if the value of said first operand is not equal to the value of said second operand; and
   coupling said comparison logic to said block equality logic and to said result output.

6. The method of claim 5 wherein P and Q equal four and wherein R equals two.

7. A method to compare the values of two N-nary operands, comprising:

receiving a 1-of-P first operand;

receiving a 1-of-Q second operand;

producing an indication of whether the value of a grouping of one or more bits of said first operand is equal to the value of a corresponding grouping of one or more bits of the said second operand;

producing a block equality indicator; and producing a 1-of-R result, where said 1-of-R result comprises an equal value if the value of said first operand is equal to the value of said second operand, said 1-of-R result further comprises a not equal value if the value of said first operand is not equal to the value of said second operand.

8. The method of claim 7 wherein P and Q equal four and wherein R equals two.

* * * * *